（12）United States Patent
Heidt

(10) Patent No.: US 8,786,924 B1
(45) Date of Patent: Jul. 22, 2014

(54) GRATING FOR TUNING A LIGHT SOURCE

(75) Inventor: Gerald Lee Heidt, Nibley, UT (US)

(73) Assignee: Wasatch Photonics, Inc., Logan, UT (US)

( * ) Notice: Subject to any disclaimer, the term of this patent is extended or adjusted under 35 U.S.C. 154(b) by 136 days.

(21) Appl. No.: 13/048,839

(22) Filed: Mar. 15, 2011

Related U.S. Application Data

(60) Provisional application No. 61/314,072, filed on Mar. 15, 2010.

(51) Int. Cl.
*G02B 5/32* (2006.01)
*H01S 5/0687* (2006.01)

(52) U.S. Cl.
CPC .................................. *H01S 5/0687* (2013.01)
USPC ............................................ 359/15; 372/32

(58) Field of Classification Search
None
See application file for complete search history.

(56) References Cited

U.S. PATENT DOCUMENTS

| 5,691,989 A | 11/1997 | Rakuljic et al. |
| 6,100,975 A * | 8/2000 | Smith et al. ................... 356/301 |
| 7,248,617 B2 * | 7/2007 | Volodin et al. ................ 372/102 |

OTHER PUBLICATIONS http://www.kosi.com/Holographic_Filters/laserbandpassfilters.php.

* cited by examiner

*Primary Examiner* — Derek S Chapel

(57) ABSTRACT

A system includes a light source and a grating cube. The grating cube includes a transmission volume holographic grating positioned between two prisms. The transmission volume holographic grating diffracts part of a light source emission toward a reflective surface, producing diffracted light. At least some of the diffracted light is reflected off of the reflective surface, producing feedback light. The feedback light is fed back to the light source, thereby causing the light source emission to have the same wavelength as the feedback light.

20 Claims, 11 Drawing Sheets

GRATING FOR TUNING A LIGHT SOURCE

PRIORITY CLAIM

This application claims the benefit of U.S. Provisional Patent Application No. 61/314,072 filed Mar. 15, 2010, for a "Laser Diode Tuning Grating," with inventor Gerald Lee Heidt.

BACKGROUND

Laser diodes are used for various reasons and various industries. There are applications where a stable wavelength and a narrow line width are necessary. The use of gratings is the most common approach for the stabilization of these laser diodes.

Two known methods for the stabilization of laser diodes involve the use of: (1) a dispersive grating technique described in U.S. Pat. No. 6,100,975 ("the '975 patent"), and (2) a narrow line width holographic grating, as described in U.S. Pat. No. 5,691,989 ("the '989 patent").

The advantages of the method described in the '975 patent are a narrow line width and greater stability than the method described in the '989 patent. The method described in the '989 patent has the benefit of the grating being in close contact to the laser diode, resulting in a smaller package.

DETAILED DESCRIPTION

At least some of the systems and methods disclosed herein allow for the stability and narrow line width of the method that is described in the '975 patent, while also allowing the tuning grating to be in close contact with the laser diode for reducing the size of the package.

Figure 1:
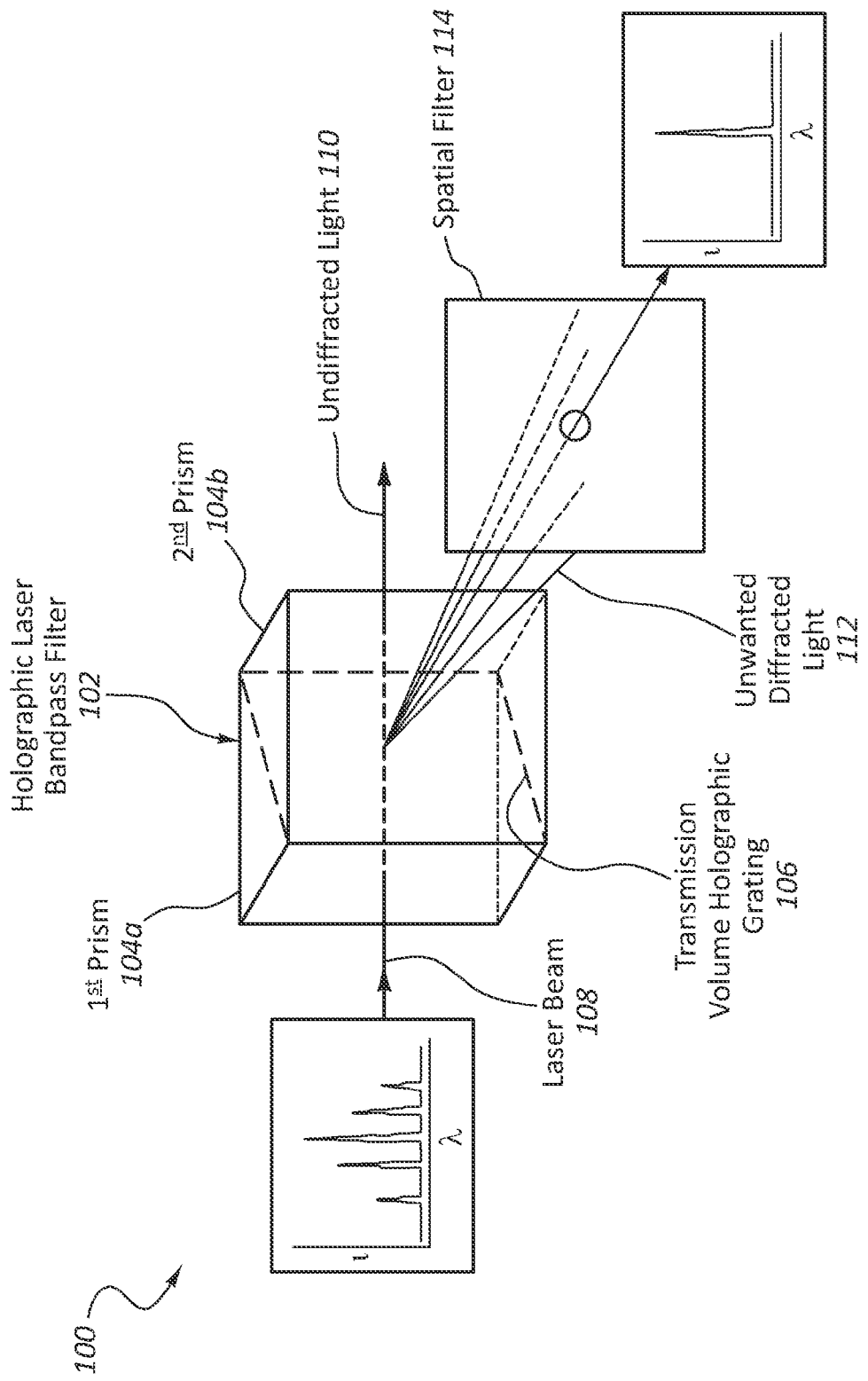
FIG. 1 illustrates an example of a holographic laser bandpass filter.

At least some of the systems and methods disclosed herein use a component that is similar to a holographic laser bandpass filter. FIG. 1 illustrates an example of a holographic laser bandpass filter 102. The holographic laser bandpass filter 102 consists of a first prism 104a, a second prism 104b, and a transmission volume holographic grating 106 positioned between the first prism 104a and the second prism 104b.

A volume holographic grating is a diffractive element consisting of a periodic phase or absorption perturbation throughout the entire volume of the element. When a beam of incident light satisfies the Bragg phase matching condition, it is diffracted by the periodic perturbation. With transmission volume holographic gratings, the incident beam and the diffracted beam are on different sides of the grating.

In the system 100 that is shown in FIG. 1, a collimated S-polarized laser beam 108 is directed perpendicularly into the first prism 104a. The transmission volume holographic grating 106 diffracts the laser beam 108 through a 90° angle. The transmission volume holographic grating 106 is spectrally selective so only the light which is very close to a desired wavelength is diffracted. The undiffracted light 110 passes through the second prism 104b. Unwanted light with wavelengths near the desired wavelength is diffracted by the transmission volume holographic grating 106 but at a different angle than the light having the desired wavelength. This unwanted diffracted light 112 can be removed by a spatial filter 114 (e.g., a slit or aperture).

The concept with laser diode tuning gratings is to send back a feedback beam to force the diode to lase at a specific wavelength. The amount of light that is fed back to the laser diode is dependent on the laser diode. This is the technique used in both the '975 patent and the '989 patent. In both cases, these methods use a reflection type of grating.

As mentioned, at least some of the systems and methods disclosed herein use a component that is similar to a holographic laser bandpass filter. However, instead of an anti-reflection coating on the output face of the holographic laser bandpass filter, a low reflection coating may be applied. This could be a metal coating, a dielectric coating, or any combination of thin film coatings. The percent of reflection can be made to accommodate the needed feedback necessary to stabilize and lock the laser diode. An added advantage to this system is that the component can still be used as a holographic laser bandpass filter as described above. This would eliminate the need for an additional component in the system.

Figure 2:
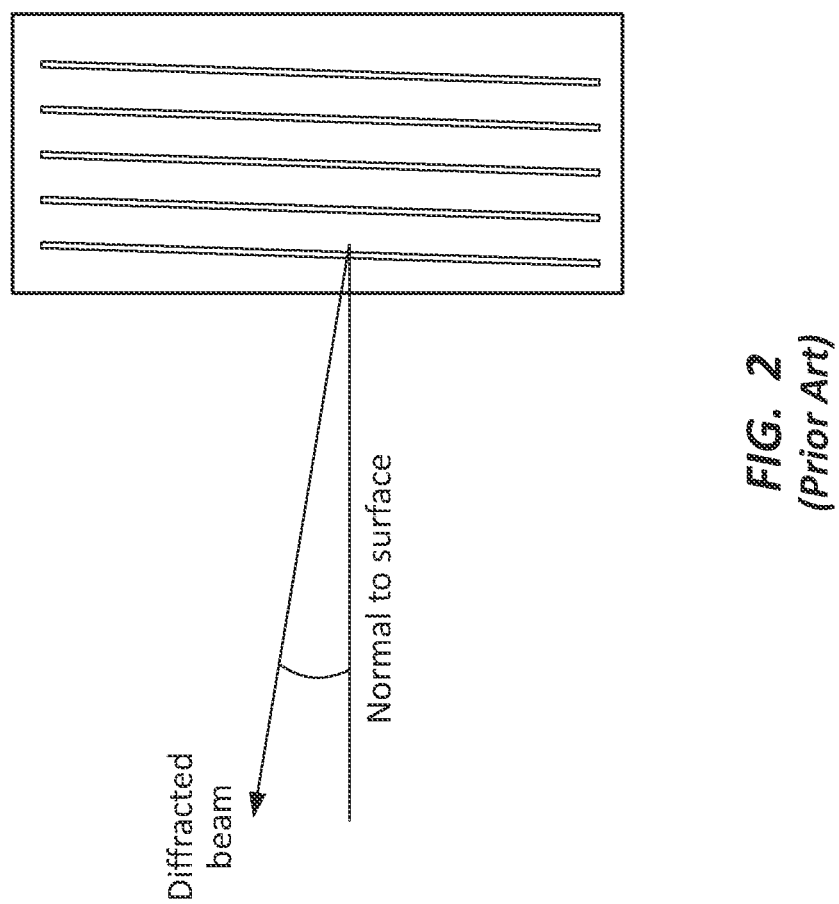
FIG. 2 illustrates an aspect of a known technique for tuning a laser diode.

The method described in the '989 patent uses a narrow band, low spatial frequency, reflection grating, as shown in FIG. 2. The fine tuning is done by using the angular dispersion of the grating.

The method described in the '975 patent uses a high spatial frequency reflection grating. The beam comes in and out at the same angle, usually at 45° to maximize the dispersion. The fine tuning is done by adjusting the angle of the grating and taking advantage of the high dispersion of the grating. The dispersion is limited to the design of the grating. The farther the grating is away from the laser diode the more narrow the line width. This is why the grating cannot be placed close to the laser diode.

In at least some of the systems and methods disclosed herein, a transmission volume holographic grating set at a 45° angle between two 45° prisms is used. This internal angle creates an extremely high spatial frequency. A portion of the light that exits the system is then reflected back through the grating in a double pass design creating even more dispersion. This allows the device to be placed in close contact with the laser diode.

For example a grating as described in the '975 patent that works in air with a half angle of 45° would have a spatial frequency of 2199.4 l/mm. This gives us an angular dispersion of about 0.18°/nm in air.

In accordance with an embodiment of the present invention, a 3343.08 l/mm grating may be created. This grating has the same angular dispersion single pass in glass but an angular dispersion of 0.27°/nm in air. With the double pass configuration it gives us an angular dispersion of 0.55°/nm in air. This is a three times increase over the method that is described in the '975 patent.

Figure 3:
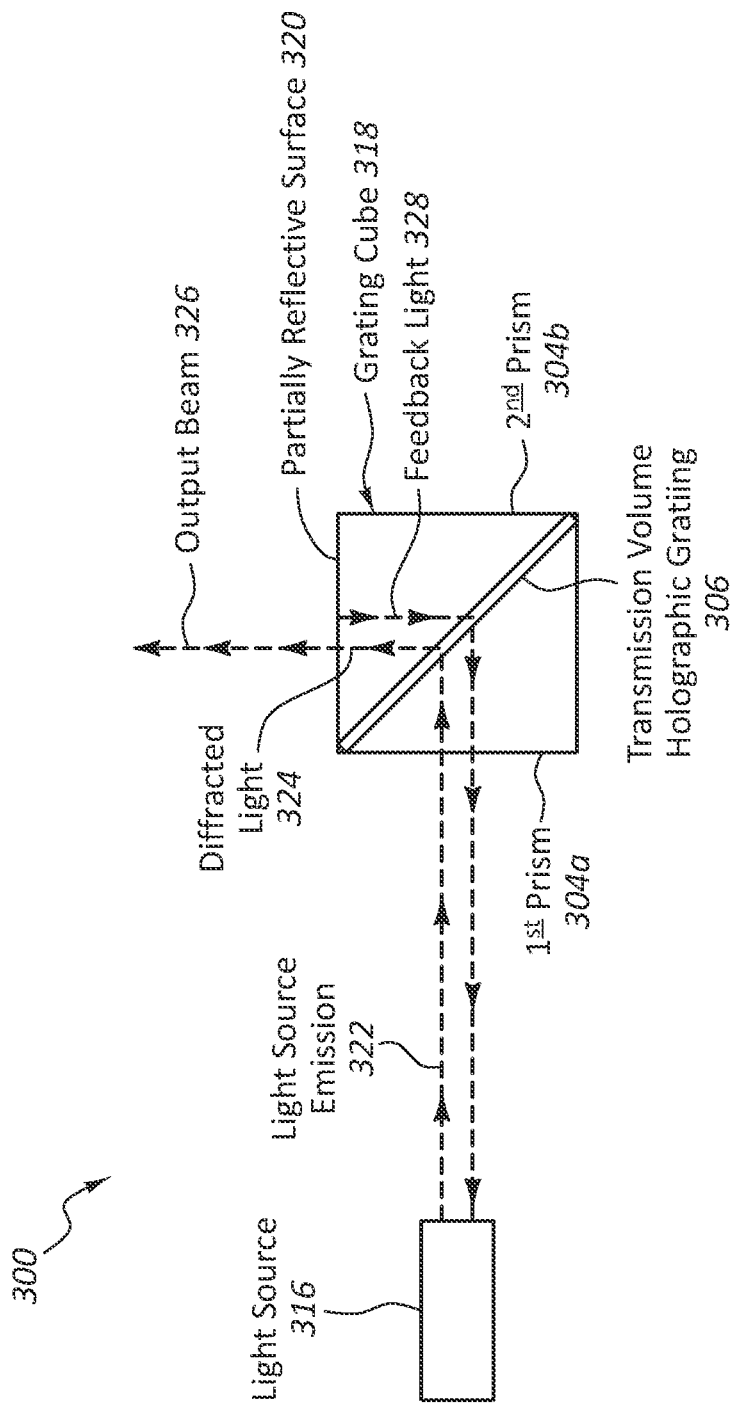
FIG. 3 illustrates a system for tuning a light source in accordance with an embodiment of the invention.

A system 300 in accordance with an embodiment of the invention will be described in relation to FIGS. 3 and 4. As shown in FIG. 3, the system 300 includes a light source 316 and a grating cube 318. The light source 316 may be a laser diode, a superluminescent diode, etc. The grating cube 318 includes a first prism 304*a*, a second prism 304*b*, and a transmission volume holographic grating 306 positioned between the first prism 304*a* and the second prism 304*b*. One of the sides of the second prism 304*b* includes a partially reflective surface 320.

An emission 322 from the light source 316 enters the grating cube 318 and is incident upon the transmission volume holographic grating 306 at a 45° angle. The transmission volume holographic grating 306 diffracts the part of the light source emission 322 that has a desired wavelength (i.e., the wavelength to which the light source 316 is being tuned) at a 90° angle toward the partially reflective surface 320, thereby producing diffracted light 324.

Some of the diffracted light 324 exits the grating cube 318 as an output beam 326. Some of the diffracted light 324 is reflected off of the partially reflective surface 320 back toward the transmission volume holographic grating 306, producing feedback light 328. The feedback light 328 is fed back to the light source 316, thereby causing the light source emission 322 to have the same wavelength as the feedback light 328. More specifically, the feedback light 328 is diffracted by the transmission volume holographic grating 306 at a 90° angle toward the light source 316.

Figure 4:
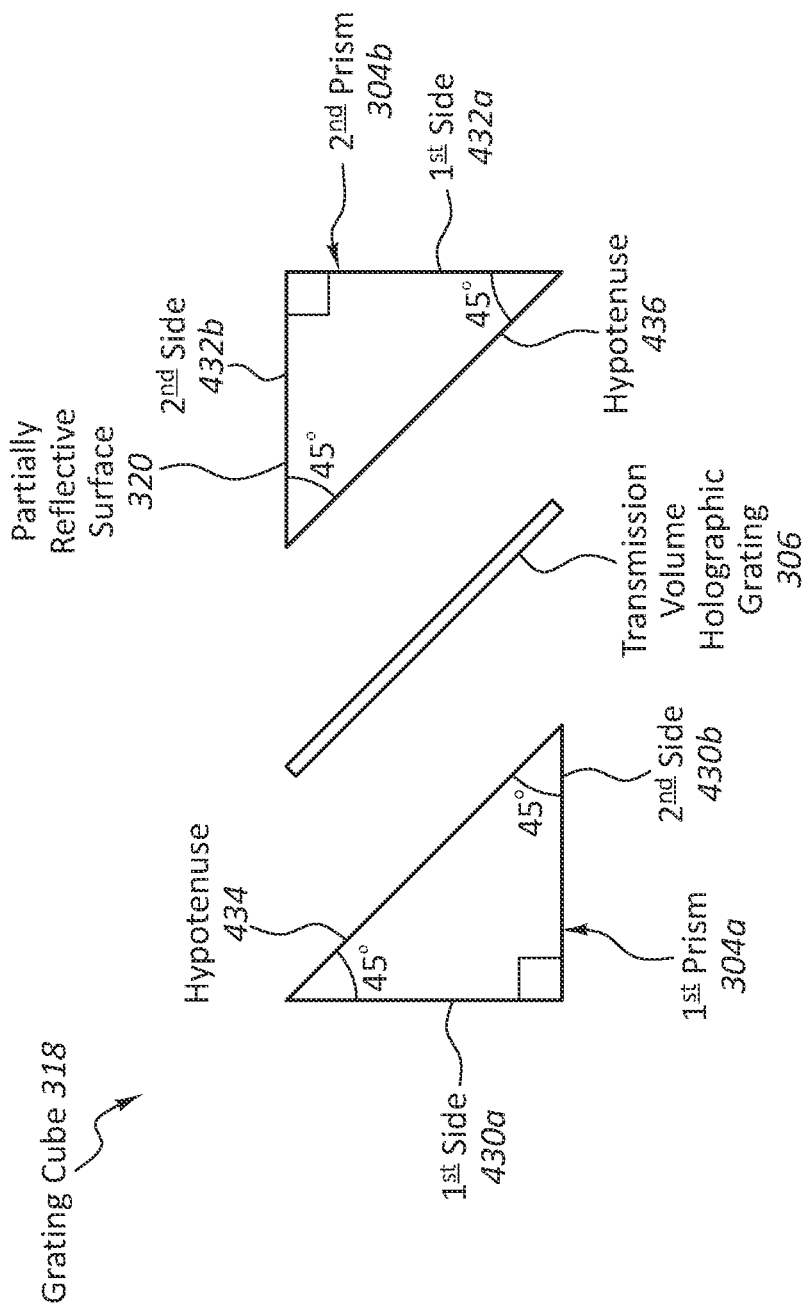
FIG. 4 is an exploded side view of a grating cube in the system of FIG. 3.

As shown in FIG. 4, the first prism 304*a* includes a first side 430*a*, a second side 430*b*, and a hypotenuse 434. There is a 45° angle between the first side 430*a* and the hypotenuse 434, a 45° angle between the second side 430*b* and the hypotenuse 434, and a 90° angle between the first side 430*a* and the second side 430*b*. Similarly, the second prism 304*b* includes a first side 432*a*, a second side 432*b*, and a hypotenuse 436. There is a 45° angle between the first side 432*a* and the hypotenuse 436, a 45° angle between the second side 432*b* and the hypotenuse 436, and a 90° angle between the first side 432*a* and the second side 432*b*.

The partially reflective surface 320 is located on the second side 432*b* of the second prism 304*b*. The partially reflective surface 320 may be created by applying a metal coating, a dielectric coating, or any combination of thin film coatings to the second side 432*b* of the second prism 304*b*. The transmission volume holographic grating 306 is positioned between the hypotenuse 434 of the first prism 304*a* and the hypotenuse 436 of the second prism 304*b*.

A grating in accordance with an embodiment of the invention can also be used to create a tunable or scanning laser or a tunable or scanning superluminescent diode. As the grating is tilted it may scan through X number of wavelengths that the laser diode or superluminescent diode is capable of producing. The grating cube could be oscillated using a microelectromechanical system (MEMS), a galvanometer, a piezoelectric type of a device, etc.

Figure 5:
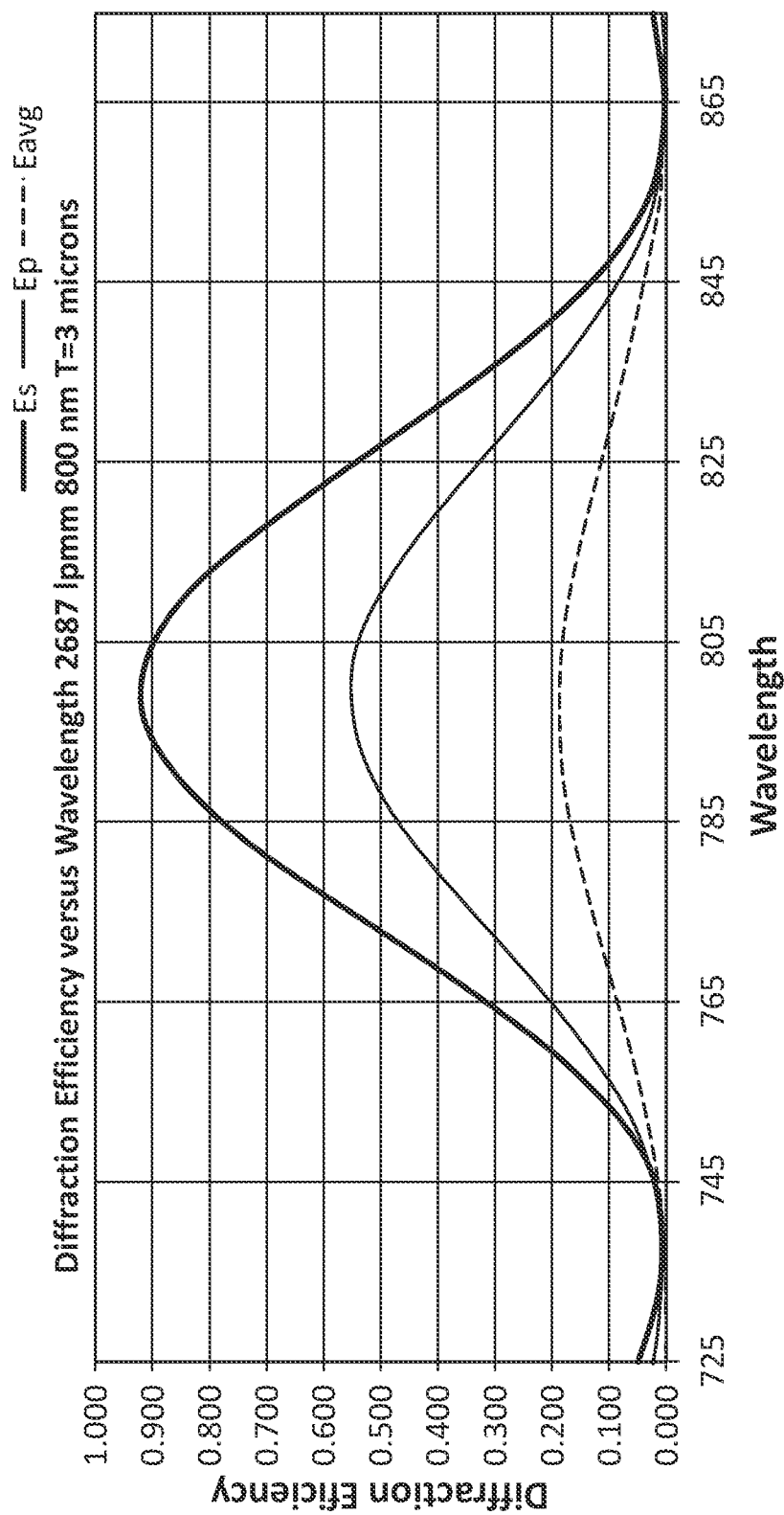
FIG. 5 illustrates an example showing the efficiency of a transmission volume holographic grating at a particular wavelength.

The calculations of this show its feasibility. FIG. 5 illustrates the efficiency of a 2687 l/mm grating at 830 nm. Other wavelengths along with their corresponding gratings can be used. This example in no way limits this technique to this configuration.

Figure 7:
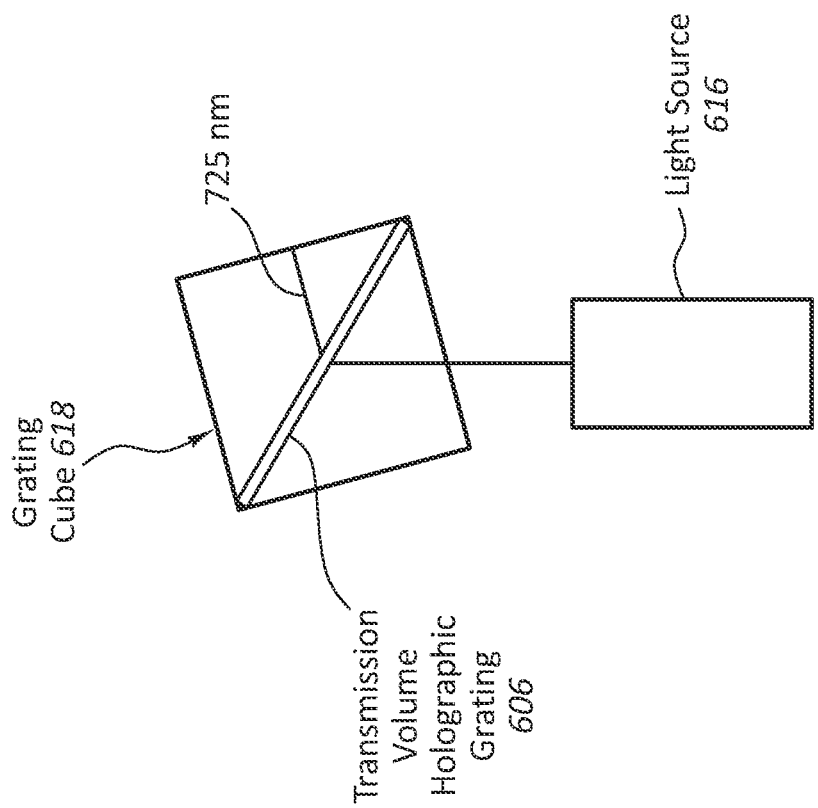
FIG. 7 illustrates the grating cube in FIG. 6 after it has been rotated.
Figure 6:
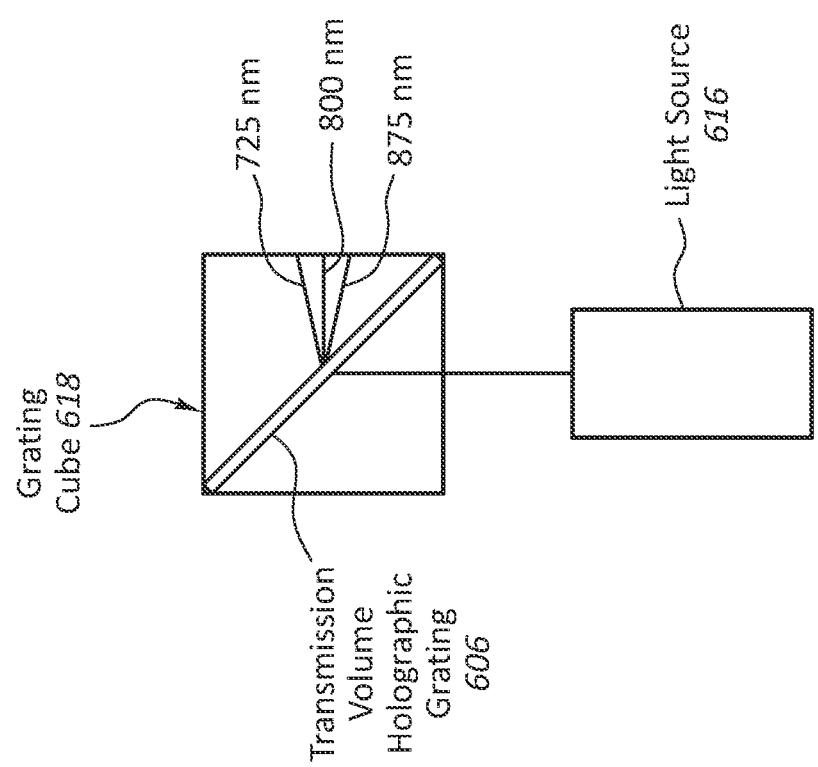
FIG. 6 illustrates a grating cube comprising a transmission volume holographic grating.
Figure 8:
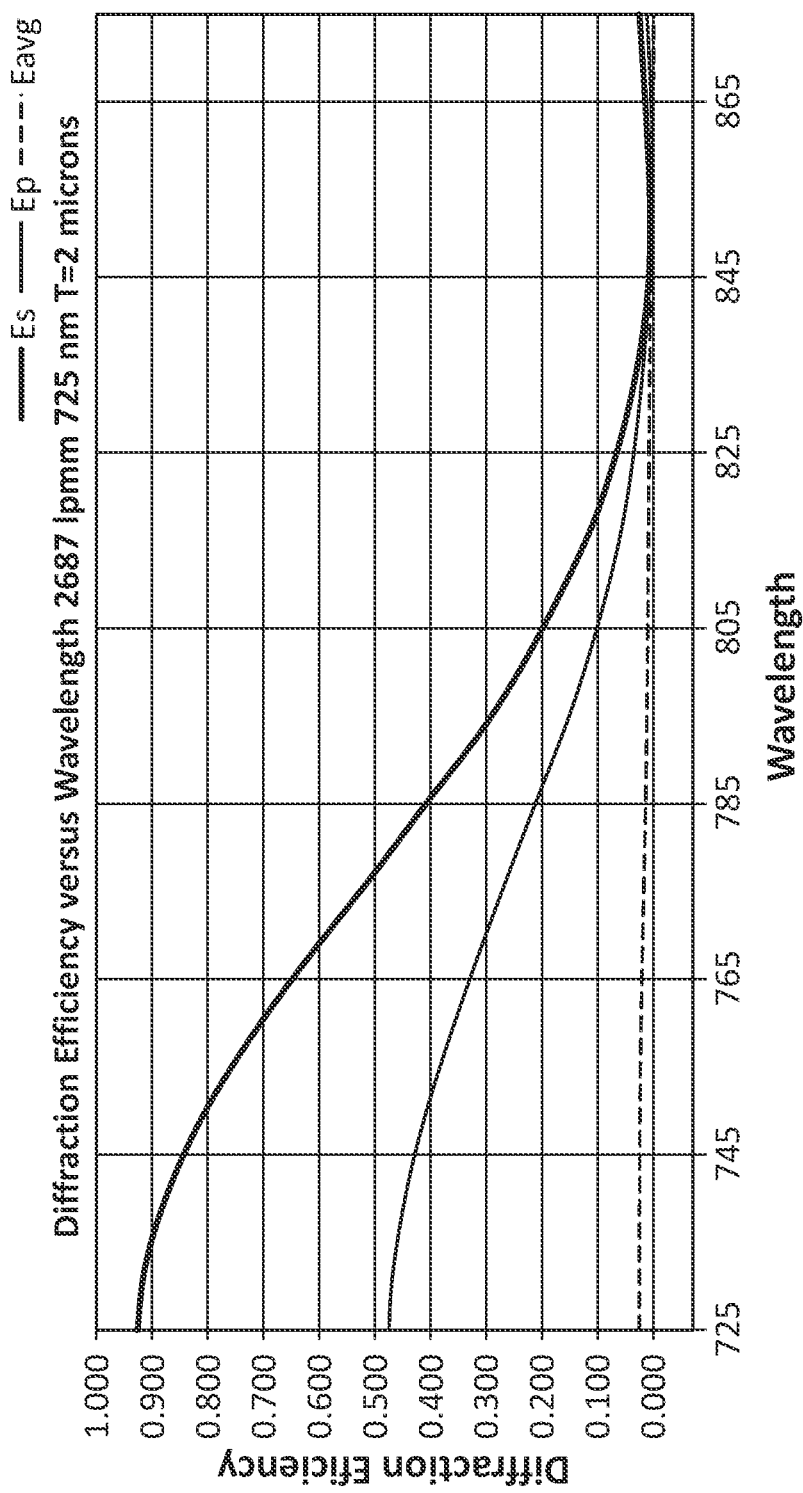
FIG. 8 shows the characteristics of a transmission volume holographic grating as it is tilted with respect to the desired wavelength.

As illustrated in FIG. 6, a grating cube 618 at this point may reflect 800 nm light back to the light source 616 for tuning the light source 616 as previously described. By rotating the grating cube 618 by 15.2°, as shown in FIG. 7, the angle of incidence on the transmission volume holographic grating 606 is now 35.07°. This may diffract 725 nm light out at 45°. Now 725 nm light may be reflected back through the transmission volume holographic grating 606 on the same path to the light source 616 so that the light source 616 is tuned for 725 nm. FIG. 8 shows that as the transmission volume holographic grating 606 is tilted with respect to the desired wavelength, the efficiency curve of the grating 606 also shifts with respect to the desired wavelength.

The same is true when the grating cube 618 is rotated in the other direction to meet the conditions of 875 nm light and all wavelengths in between as they meet the angular conditions of the design and the grating 606. Thus by adjusting the angle of the grating cube 618, the light source 616 can be tuned to a wide variety of allowed wavelengths. By using a device—such as, but not limited to, a MEMs, a piezoelectric-type device, or a galvanometer—for rapidly changing through these angles, a scanning light source may be created.

Figure 9:
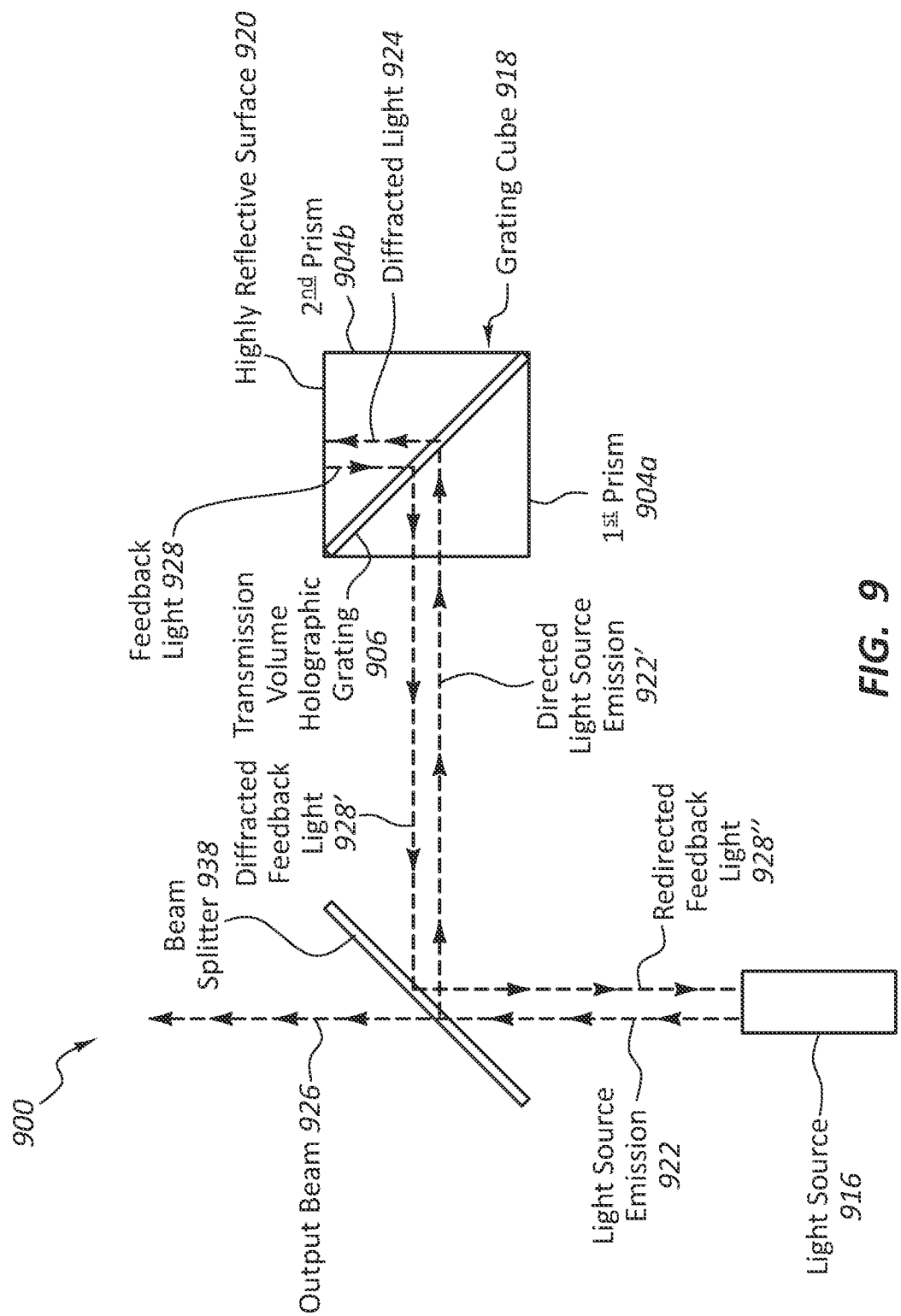
FIG. 9 illustrates a system for creating a tunable or scanning light source in accordance with an embodiment of the invention.

One issue with this method is the fact that the output beam will not be constant. It will also displace the output beam through a variety of angles. A solution to this is as follows. Referring to FIG. 9, a light source emission 922 may be peeled off a beam splitter 938 at n %. The percent of light may vary depending on the light source 916, just as the partially reflected surface 320 of the grating cube 318 may vary as previously described. The light source 916 may be a laser diode, a superluminescent diode, etc.

The diverted light source emission 922' may then enter the grating cube 918 and be diffracted. However, other than a slightly reflective surface on the output, the grating cube 918 may have a high reflector output. This will send all the diffracted light 924 back down the desired path, back to the beam splitter 938 and back onto the light source 916. Since the output beam 926 is now through the beam splitter 938, which is stationary, the output beam 926 stays constant.

More specifically, some of the light source emission 922 is diverted by the beam splitter 938 toward the grating cube 918, thereby producing a diverted light source emission 922'. The transmission volume holographic grating 906 diffracts the part of the diverted light source emission 922' that has a particular wavelength at a 90° angle toward the highly reflective surface 920, thereby producing diffracted light 924.

All (or substantially all) of the diffracted light 924 is reflected off of the highly reflective surface 920 back toward the transmission volume holographic grating 906, producing feedback light 928. The feedback light 928 is fed back to the light source 916, thereby causing the light source emission 922 to have the same wavelength as the feedback light 928. More specifically, the feedback light 928 is diffracted by the transmission volume holographic grating 906 at a 90° angle toward the beam splitter 938. Then, the diffracted feedback light 928' is redirected by the beam splitter 938 toward the light source 916.

The grating cube 918 may be rotated by, e.g., a MEMs, a piezoelectric-type device, a galvanometer, etc. The rotation of the grating cube 918 causes the angle of incidence of the diverted light source emission 922' upon the transmission volume holographic grating 906 to vary. Varying the angle of incidence of the diverted light source emission 922' on the transmission volume holographic grating 906 causes the wavelength of the diffracted light 924 to vary. Varying the wavelength of the diffracted light 924 causes the wavelength of the feedback light 928, the diffracted feedback light 928', the diverted feedback light 928", the light source emission 922, and the output beam 926 to vary as well.

Figure 10:
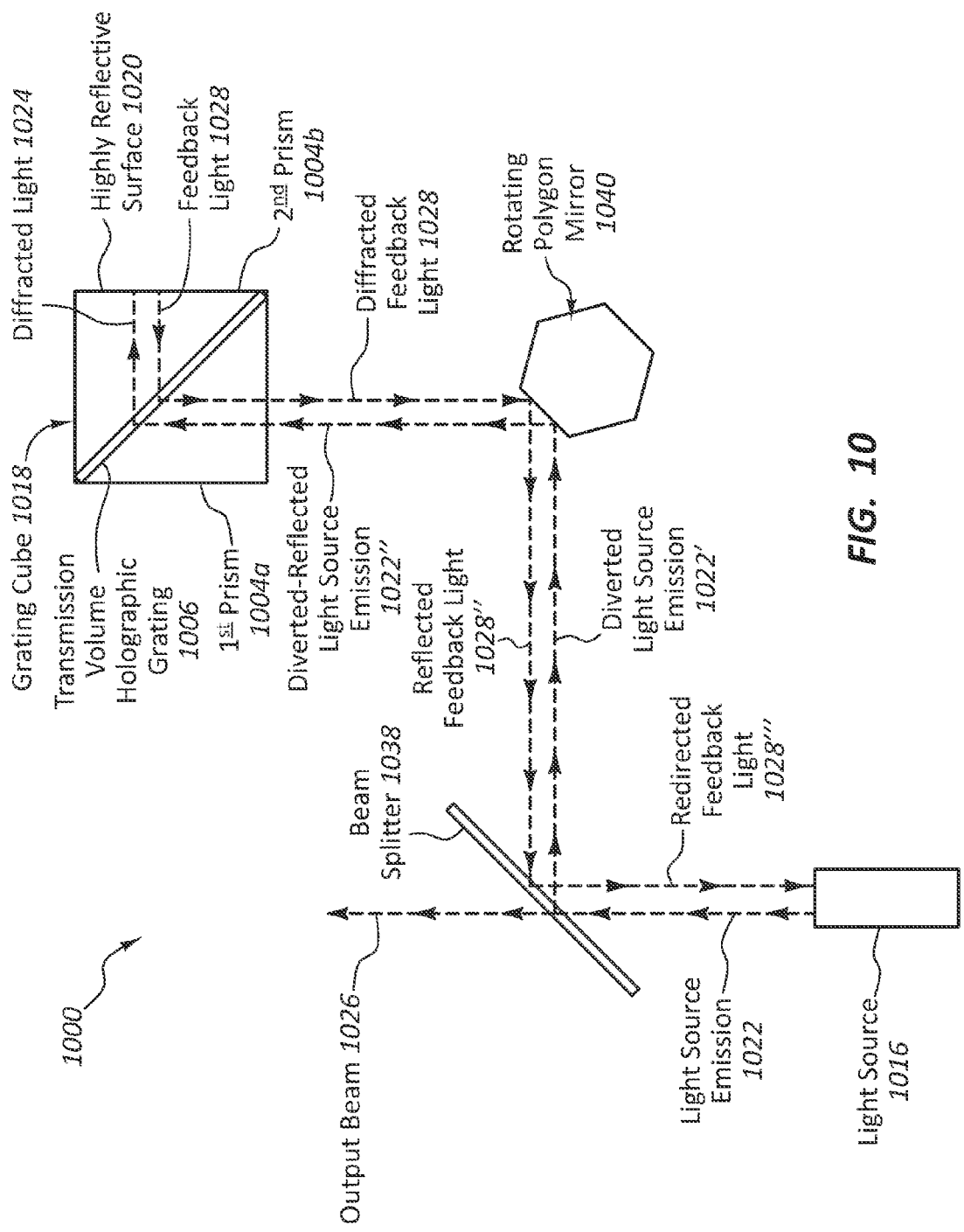
FIG. 10 illustrates a system for creating a tunable or scanning light source in accordance with another embodiment of the invention.

The light from a light source such as a laser diode or a superluminescent diode can also be scanned by the use of a rotating polygon mirror, a MEMs, a piezoelectric-type device, a galvanometer, or the like placed before the grating cube. An example of this type of configuration is shown in FIG. 10. The system 1000 that is shown in FIG. 10 includes a light source 1016, a beam splitter 1038, a rotating polygon mirror 1040 (although, as mentioned, another type of scanning device could be used instead), and a grating cube 1018. The grating cube 1018 includes a first prism 1004*a*, a second prism 1004*b*, and a transmission volume holographic grating 1006 positioned between the first prism 1004*a* and the second prism 1004*b*. One of the sides of the second prism 1004*b* includes a highly reflective surface 1020 that reflects all, or substantially all, of the light that is incident upon it.

Some of the light source emission 1022 is transmitted by the beam splitter 1038 as an output beam 1026. Some of the light source emission 1022 is diverted by the beam splitter 1038 toward the rotating polygon mirror 1040. The diverted light source emission 1022' is reflected by the rotating polygon mirror 1040 toward the grating cube 1018. The diverted-reflected light source emission 1022" enters the grating cube 1018. The transmission volume holographic grating 1006 diffracts the part of the diverted-reflected light source emission 1022" that has a particular wavelength at a 90° angle toward the highly reflective surface 1020.

All (or substantially all) of the diffracted light 1024 is reflected off of the highly reflective surface 1020 back toward the transmission volume holographic grating 1006, thereby producing feedback light 1028. The feedback light 1028 is fed back to the light source 1016, thereby causing the light source emission 1022 to have the same wavelength as the feedback light 1028. More specifically, the feedback light 1028 is diffracted by the transmission volume holographic grating 1006 at a 90° angle toward the rotating polygon mirror 1040. Then, the diffracted feedback light 1028' is reflected by the rotating polygon mirror 1040 toward the beam splitter 1038. Then, the reflected feedback light 1028" is redirected by the beam splitter 1038 toward the light source 1016.

The rotation of the rotating polygon mirror 1040 causes the angle of incidence of the diverted-reflected light source emission 1022" upon the transmission volume holographic grating 1006 to vary. Varying the angle of incidence of the diverted-reflected light source emission 1022" on the transmission volume holographic grating 1006 causes the wavelength of the diffracted light 1024 to vary. Varying the wavelength of the diffracted light 1024 causes the wavelength of the feedback light 1028, the diffracted feedback light 1028', the reflected feedback light 1028", the redirected feedback light 1028''', the light source emission 1022, and the output beam 1026 to vary as well.

In one or more of the systems and methods described above, the beam may scan different parts of the grating since the light may change angles over the surface of the grating. Another method for scanning the spectrum would be to put the scanning device on the output end of the grating cube and eliminate the reflective surface. The light and diffracted light remain a constant angle and spot on the grating. This method also uses angles that are closer to the Bragg condition for the bandwidth being scanned.

Figure 11:
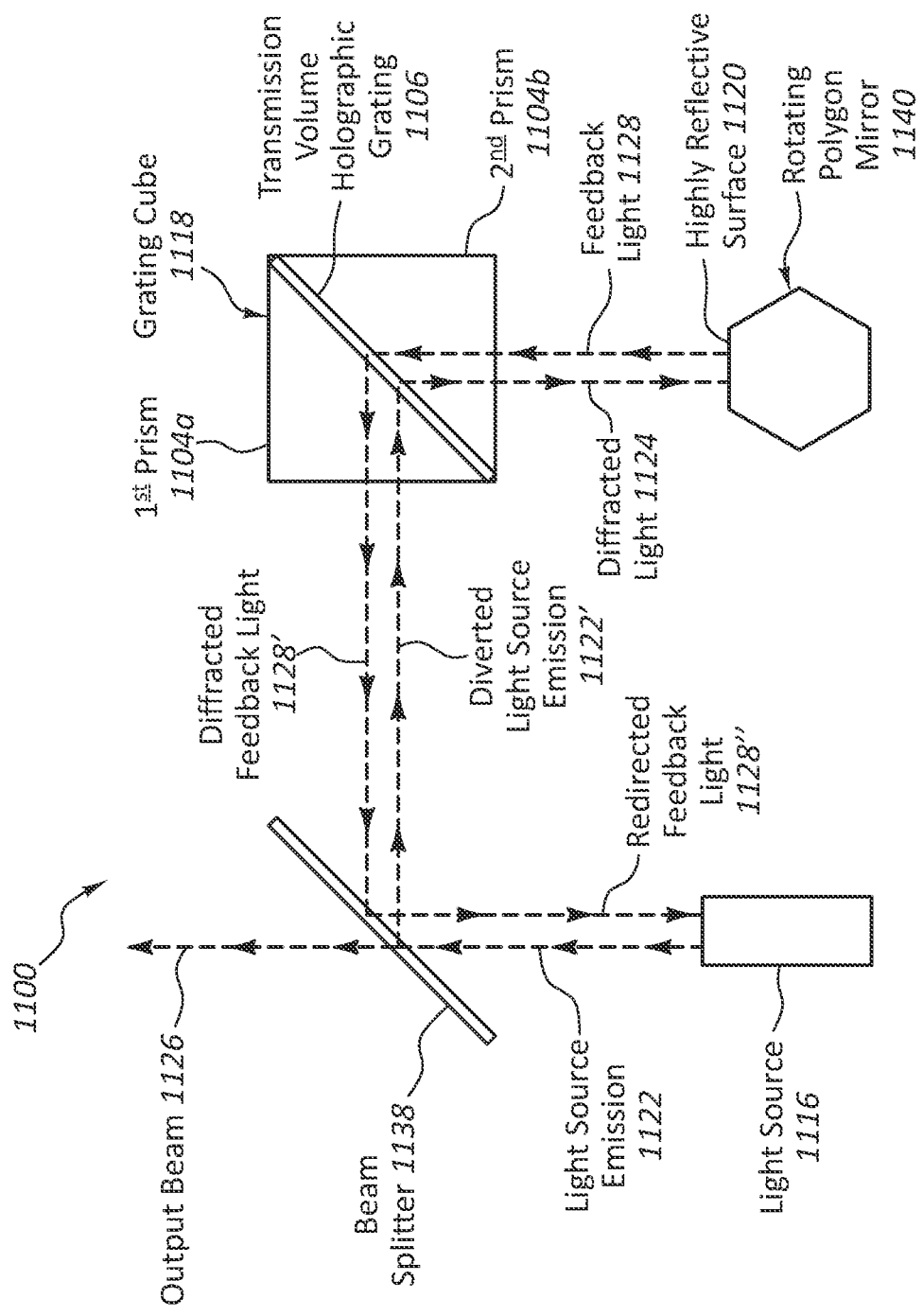
FIG. 11 illustrates a system for creating a tunable or scanning light source in accordance with another embodiment of the invention.

An example of this type of configuration is shown in FIG. 11. The system 1100 that is shown in FIG. 11 includes a light source 1116, a beam splitter 1138, a grating cube 1118, and a rotating polygon mirror 1140 (although another type of scanning device could be used instead). The light source 1116 may be a laser diode, a superluminescent diode, etc. The grating cube 1118 includes a first prism 1104*a*, a second prism 1104*b*, and a transmission volume holographic grating 1106 positioned between the first prism 1104*a* and the second prism 1104*b*.

Some of the light source emission 1122 is transmitted by the beam splitter 1138 as an output beam 1126. Some of the light source emission 1122 is diverted by the beam splitter 1138 toward the grating cube 1118. The diverted light source emission 1122' enters the grating cube 1118. The transmission volume holographic grating 1106 diffracts the part of the diverted light source emission 1122' that has a particular wavelength at a 90° angle toward the rotating polygon mirror 1140—and, more specifically, toward a highly reflective surface 1120 of the rotating polygon mirror 1140.

All (or substantially all) of the diffracted light 1124 is reflected off of the highly reflective surface 1120 of the rotating polygon mirror 1140 back toward the transmission volume holographic grating 1106, thereby producing feedback light 1128. The feedback light 1128 is fed back to the light source 1116, thereby causing the light source emission 1122 to have the same wavelength as the feedback light 1128. More specifically, the feedback light 1128 is diffracted by the transmission volume holographic grating 1106 at a 90° angle toward the beam splitter 1138. Then, the diffracted feedback light 1128' is redirected by the beam splitter 1138 toward the light source 1116.

The rotation of the rotating polygon mirror 1140 causes the angle of incidence of the feedback light 1128 upon the transmission volume holographic grating 1106 to vary. Varying the angle of incidence of the feedback light 1128 on the transmission volume holographic grating 1106 causes the wavelength of the diffracted feedback light 1128' to vary. Varying the wavelength of the diffracted feedback light 1128' causes the wavelength of the redirected feedback light 1128", the light source emission 1122, and the output beam 1126 to vary as well.

Figure 12:
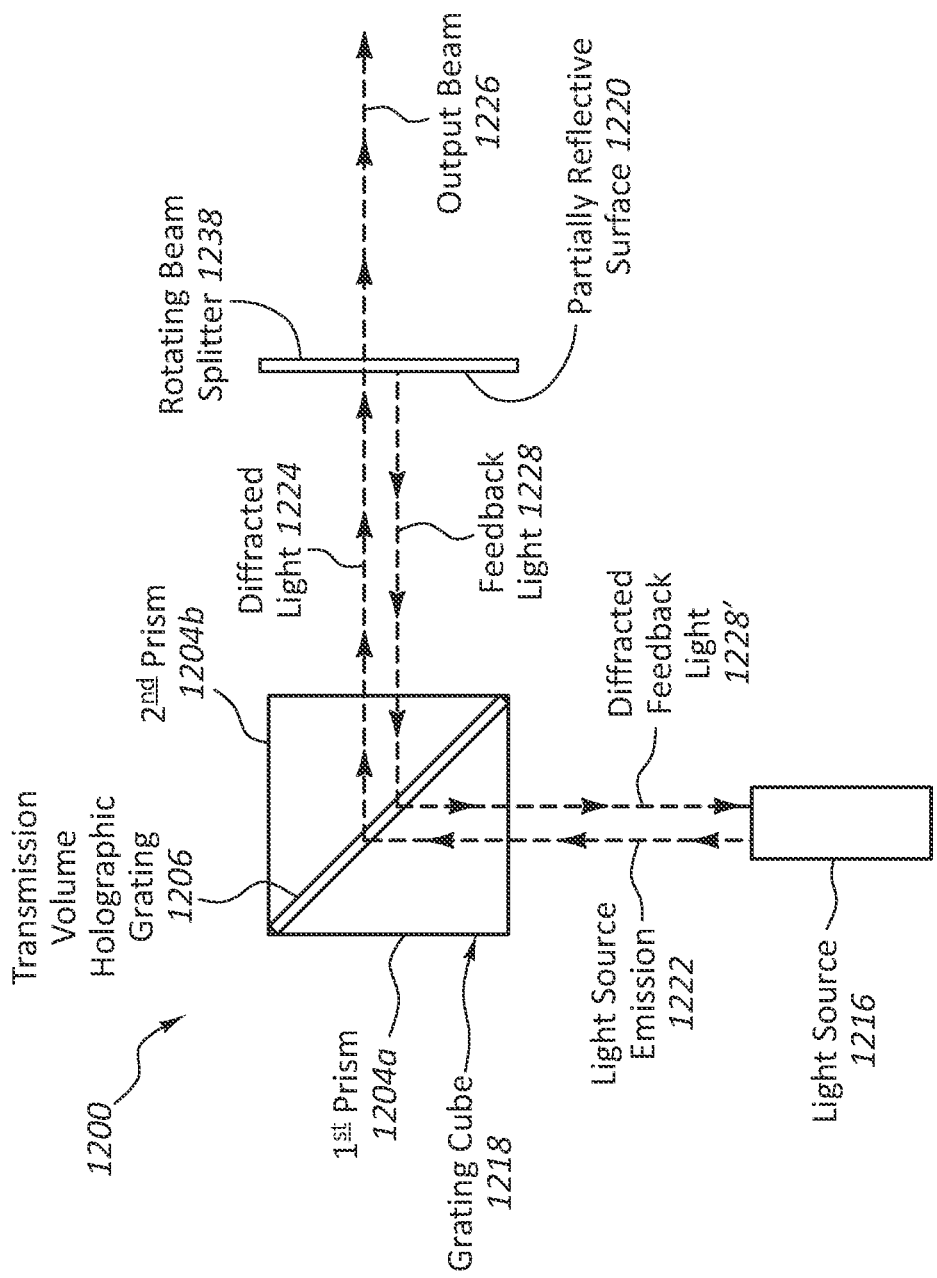
FIG. 12 illustrates a system for creating a tunable or scanning light source in accordance with another embodiment of the invention.

FIG. 12 illustrates a system 1200 in which the scanning device is a rotating beam splitter 1238. In addition to the rotating beam splitter 1238, the system 1200 also includes a light source 1216 and a grating cube 1218. The light source 1216 may be a laser diode, a superluminescent diode, etc. The grating cube 1218 includes a first prism 1204*a*, a second prism 1204*b*, and a transmission volume holographic grating 1206 positioned between the first prism 1204*a* and the second prism 1204*b*. The rotating beam splitter 1238 includes a partially reflective surface 1220.

The light source emission 1222 enters the grating cube 1218 and is incident upon the transmission volume holographic grating 1206 at a 45° angle. The transmission volume holographic grating 1206 diffracts the part of the light source emission 1222 that has a particular wavelength at a 90° angle toward the rotating beam splitter 1238.

Some of the diffracted light 1224 is transmitted by the rotating beam splitter 1238 as an output beam 1226, while some of the diffracted light 1224 is reflected off of the partially reflective surface 1220 of the rotating beam splitter 1238 back toward the transmission volume holographic grating 1206 as feedback light 1228. The feedback light 1228 is fed back to the light source 1216, thereby causing the light source emission 1222 to have the same wavelength as the feedback light 1228. More specifically, the feedback light 1228 is diffracted by the transmission volume holographic grating 1206 at a 90° angle toward the light source 1216.

The rotation of the rotating beam splitter 1238 causes the angle of incidence of the feedback light 1228 upon the transmission volume holographic grating 1206 to vary. Varying the angle of incidence of the feedback light 1228 on the transmission volume holographic grating 1206 causes the wavelength of the diffracted feedback light 1228' to vary. Varying the wavelength of the diffracted feedback light 1228' causes the wavelength of the light source emission 1222, the diffracted light 1224, and the output beam 1226 to vary as well.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A system, comprising:
   a light source; and
   a grating cube that comprises a transmission volume holographic grating positioned between two prisms;
   wherein:
      the transmission volume holographic grating diffracts a desired wavelength of light;
      at least some diffracted light produced by the transmission volume holographic grating is reflected off of a partially reflective surface, producing feedback light; and
      the feedback light is fed back to the light source, thereby causing a light source emission to have the same wavelength as the feedback light.

2. The system of claim 1, wherein the partially reflective surface is located on a side of one of the two prisms of the grating cube.

3. The system of claim 1, wherein the feedback light is diffracted by the transmission volume holographic grating toward the light source.

4. The system of claim 1, wherein some of the diffracted light exits the grating cube as an output beam.

5. The system of claim 1, further comprising a beam splitter, wherein the beam splitter comprises the partially reflective surface.

6. The system of claim 1, wherein at least one of the two prisms comprises a highly reflective surface.

7. The system of claim 1, further comprising a rotating scanning device.

8. The system of claim 7, further comprising a beam splitter, wherein the beam splitter comprises the partially reflective surface, and wherein the diffracted light produced by the transmission volume holographic grating is reflected off of the rotating scanning device toward the partially reflective surface on the beam splitter.

9. The system of claim 7, wherein a side of one of the two prisms of the grating cube comprises a highly reflective surface, and wherein the transmission volume holographic grating diffracts light reflected from the highly reflective surface toward the rotating scanning device.

10. The system of claim 7, wherein light that is reflected off of the rotating scanning device toward the grating cube is then diffracted by the transmission volume holographic grating to produce the diffracted light.

11. The system of claim 7, further comprising a beam splitter, wherein the beam splitter comprises the partially reflective surface, wherein the rotating scanning device comprises a highly reflective surface, and wherein the transmission volume holographic grating diffracts light reflected from the highly reflective surface on the rotating scanning device toward the partially reflective surface on the beam splitter.

12. The system of claim 1, wherein the light source emission enters the grating cube and is incident upon the transmission volume holographic grating at a 45° angle.

13. The system of claim 1, wherein the transmission volume holographic grating diffracts part of the light source emission toward the partially reflective surface.

14. The system of claim 1, further comprising a beam splitter, wherein the beam splitter comprises the partially reflective surface, wherein a side of one of the two prisms of the grating cube comprises a highly reflective surface, and wherein the transmission volume holographic grating diffracts light reflected from the highly reflective surface toward the partially reflective surface on the beam splitter.

15. The system of claim 1, wherein the two prisms comprise a first prism and a second prism, and wherein the transmission volume holographic grating is positioned between a hypotenuse of the first prism and a hypotenuse of the second prism.

16. The system of claim 1, further comprising a device that rotates the grating cube.

17. The system of claim 1, further comprising a beam splitter, wherein the beam splitter comprises the partially reflective surface, and wherein part of the light source emission is transmitted by the beam splitter as an output beam.

18. The system of claim 1, further comprising a rotating scanning device and a beam splitter, wherein the beam splitter comprises the partially reflective surface, wherein part of the light source emission is diverted by the beam splitter toward the rotating scanning device, and wherein the diverted light source emission is reflected by the rotating scanning device toward the grating cube.

19. The system of claim 1, further comprising a beam splitter, wherein part of the light source emission is diverted by the beam splitter toward the grating cube.

20. The system of claim 1, further comprising a rotating beam splitter, wherein the rotating beam splitter comprises the partially reflective surface, and wherein the transmission volume holographic grating diffracts part of the light source emission toward the partially reflective surface on the rotating beam splitter.

* * * * *